(12) United States Patent
Choi et al.

(10) Patent No.: US 10,714,450 B2
(45) Date of Patent: Jul. 14, 2020

(54) METHOD OF BONDING TERMINAL OF SEMICONDUCTOR CHIP USING SOLDER BUMP AND SEMICONDUCTOR PACKAGE USING THE SAME

(71) Applicant: JMJ Korea Co., Ltd., Bucheon-si, Gyeonggi-do (KR)

(72) Inventors: Yun Hwa Choi, Bucheon-si (KR); SoonSeong Choi, Gunpo-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 0 days.

(21) Appl. No.: 16/371,134

(22) Filed: Apr. 1, 2019

(65) Prior Publication Data

US 2020/0006281 A1    Jan. 2, 2020

(30) Foreign Application Priority Data

Jul. 2, 2018   (KR) .................. 10-2018-0076361

(51) Int. Cl.
| | |
|---|---|
| *H01L 21/44* | (2006.01) |
| *H01L 29/40* | (2006.01) |
| *H01L 23/00* | (2006.01) |
| *H01L 23/31* | (2006.01) |
| *H01L 23/498* | (2006.01) |
| *H01L 21/60* | (2006.01) |

(52) U.S. Cl.
CPC .......... *H01L 24/81* (2013.01); *H01L 23/3128* (2013.01); *H01L 23/49816* (2013.01); *H01L 24/12* (2013.01); *H01L 24/13* (2013.01); *H01L 24/16* (2013.01); *H01L 24/95* (2013.01); *H01L 2021/60022* (2013.01); *H05K 2201/09227* (2013.01)

(58) Field of Classification Search
CPC .... H01L 23/49816; H01L 24/13; H01L 24/16
USPC .................. 438/611–614; 257/772, 779–781
See application file for complete search history.

(56) References Cited

U.S. PATENT DOCUMENTS

| | | | |
|---|---|---|---|
| 8,012,865 B2* | 9/2011 | Mehrotra ............ | H01L 23/3735 228/193 |
| 8,236,687 B2* | 8/2012 | Lin ........................ | H01L 24/29 438/660 |
| 8,742,600 B2* | 6/2014 | Chang ............... | H01L 23/49811 257/782 |

(Continued)

FOREIGN PATENT DOCUMENTS

| | | |
|---|---|---|
| JP | 3348528 B2 | 11/2002 |
| JP | 2015-115419 A | 6/2015 |

(Continued)

*Primary Examiner* — Calvin Lee
(74) *Attorney, Agent, or Firm* — Park, Kim & Suh, LLC

(57) ABSTRACT

A method of bonding a terminal of a semiconductor chip using a solder bump includes preparing a semiconductor chip with an aluminum (Al) pad terminal formed thereon (S-1), forming a solder bump on the Al pad terminal through a primary solder (S-2), attaching the solder bump and a metal structure to each other via a secondary solder with a higher melting point than a melting point of the primary solder (S-3), performing heat treatment in an attachment state (S-4), and mixing the primary solder and the secondary solder that are melted during the heat treatment and converting a resulting mixture into a tertiary solder including one solder layer (S-4).

3 Claims, 10 Drawing Sheets

(56) References Cited

U.S. PATENT DOCUMENTS

| | | | |
|---|---|---|---|
| 8,810,035 B2* | 8/2014 | Nakamura | B23K 1/0016<br>257/762 |
| 9,355,980 B2* | 5/2016 | Chen | H01L 24/16 |
| 9,741,682 B2* | 8/2017 | Arvin | H01L 24/17 |

FOREIGN PATENT DOCUMENTS

| | | |
|---|---|---|
| KR | 10-1208332 B1 | 12/2012 |
| KR | 10-1332532 B2 | 11/2013 |
| KR | 10-1631232 B1 | 6/2016 |
| KR | 10-1669902 B1 | 10/2016 |
| KR | 20-0482370 Y1 | 2/2017 |

* cited by examiner

METHOD OF BONDING TERMINAL OF SEMICONDUCTOR CHIP USING SOLDER BUMP AND SEMICONDUCTOR PACKAGE USING THE SAME

CROSS-REFERENCE TO RELATED APPLICATIONS

This application claims priority from Korean Patent Application No. 10-2018-0076361, filed on Jul. 2, 2018, in the Korean Intellectual Property Office, the disclosure of which is incorporated herein by reference in its entirety.

BACKGROUND OF THE INVENTION

Field of the Invention

The present invention relate to a method of bonding a terminal of a semiconductor chip using a solder bump and a semiconductor package using the same, and more particularly, to technology for changing properties to increase a melting point of a solder layer that is completely bonded using a solder bump compared than an original melting point of a solder bump to enhance heat resistance of a completed semiconductor package and to prevent a re-melting phenomenon in a post-processing process.

Description of the Related Art

In general, a semiconductor package includes a semiconductor chip, a lead frame (or a substrate), and a package body, and the semiconductor chip is bonded onto a pad of the lead frame and is electrically connected to a lead of the lead frame via bonding of a metal wire.

However, because a conventional stack package using a metal wire electrically exchanges a signal through a metal wire, a signal exchange speed of the stack package is low, and the electrical properties of each chip are degraded due to use of a large number of wires. An additional area of a substrate is required to form a metal wire to increase the size of the package, and a gap for wire bonding to a bonding pad of each chip is required, and thus, there is a problem in that the entire height of the package is unnecessarily increased.

Accordingly, the cited references disclosed by the present inventor, i.e., Korean Patent No. 1208332, Korean Utility Model No. 0482370, Korean Patent No. 1669902, and Korean Patent No. 1631232 disclose an effective package structure that uses a metallic clip structure to have excellent electrical connection performance, easy heat dissipation, and high thermal stability, compared with a conventional semiconductor package using a metal wire.

However, it is not possible to solder a metal clip directly to a semiconductor chip, and thus, bonding is achieved by forming a metal bump on the semiconductor chip. In this case, the metal bump is formed of a metal for easy soldering, such as copper (Cu) or gold (Au), and thus, there is a problem in that bonding force between the metal bump and a bonding pad and electrical connection properties are degraded due to different thermal expansion coefficients.

SUMMARY OF THE INVENTION

The present invention provides a method of bonding a terminal of a semiconductor chip using a solder bump and a semiconductor package using the same, for forming a solder bump on an aluminum (Al) pad terminal formed on a semiconductor chip to bond a metal structure configured in the form of a clip or a post and for enhancing a bonding method and changing properties to increase a melting point of a solder layer, to smoothly achieving bonding, to enhance heat resistance of a completed semiconductor package, and to prevent a re-melting phenomenon in a post-processing process.

According to an aspect of the present invention, a method of bonding a terminal of a semiconductor chip using a solder bump includes preparing a semiconductor chip with an aluminum (Al) pad terminal formed thereon, forming the solder bump on the Al pad terminal through a primary solder, attaching the solder bump and a metal structure to each other via a secondary solder with a higher melting point than a melting point of the primary solder, performing heat treatment in a state in which the solder bump and the metal structure are attached, and mixing the primary solder and the secondary solder that are melted during the heat treatment and converting a resulting mixture into a tertiary solder including one solder layer.

The forming of the solder bump (S-2) may include forming an intermetallic compound (IMC) on a portion of the solder, adjacent to the Al pad terminal, to be distributed by a predetermined region during formation of the solder bump.

Al may be included in the IMC, and a ratio of the Al may be 2 to 30 parts by weight based on 100 parts by weight of the entire IMC.

A heat treatment temperature of the heat treatment may be determined based on the melting point of the secondary solder.

The primary solder may have a melting point of 180 to 230° C., the secondary solder has a melting point of 260 to 350° C., and the tertiary solder may have a melting point of 230 to 260° C.

According to another aspect of the present invention, a semiconductor package using the method of bonding the terminal of the semiconductor chip includes a semiconductor chip, an aluminum (Al) pad terminal formed on the semiconductor chip, a metal structure bonded to the Al pad terminal via a solder layer, wherein the Al pad terminal and the metal structure are bonded to each other by the solder layer using the method of bonding the terminal of the semiconductor chip using the solder bump.

BRIEF DESCRIPTION OF THE DRAWING FIGURES

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

Hereinafter, the present invention will be described in detail by explaining exemplary embodiments of the invention with reference to the attached drawings. In the description of the present invention, certain detailed explanations of related art are omitted when it is deemed that they may unnecessarily obscure the essence of the invention.

Figure 1:
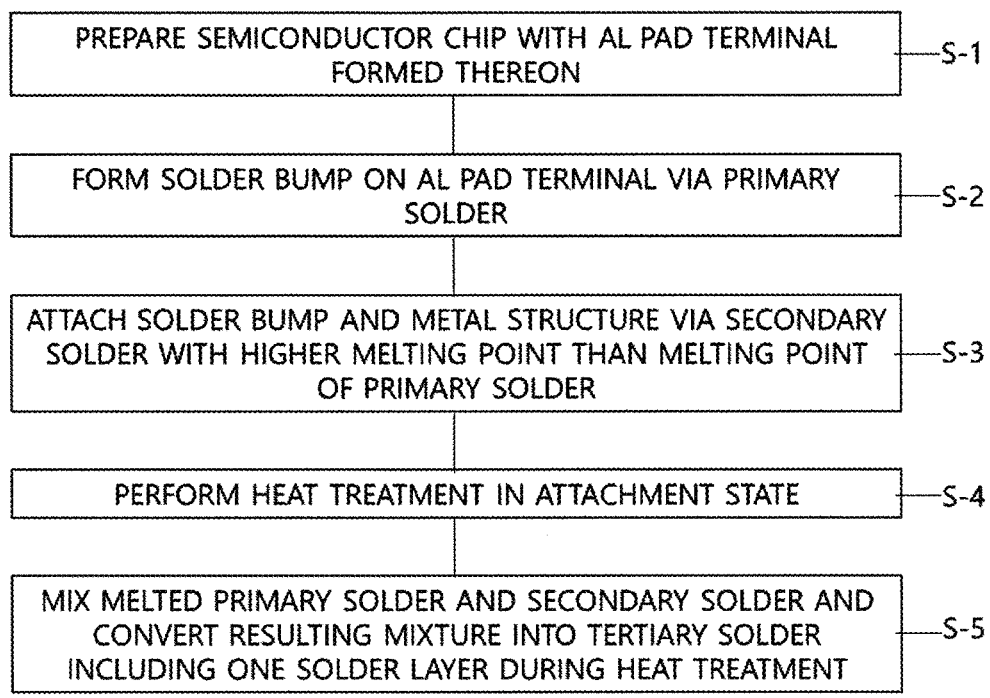
FIG. 1 is a block diagram showing a method of bonding a terminal of a semiconductor chip using a solder bump according to the present invention.

As shown in FIG. 1, a method of bonding a terminal of a semiconductor chip using a solder bump according to the present invention may include preparing a semiconductor chip with an aluminum (Al) pad terminal formed thereon (S-1), forming a solder bump on the Al pad terminal through a primary solder (S-2), attaching the solder bump and a metal structure to each other via a secondary solder with a higher melting point than a melting point of the primary solder (S-3), performing heat treatment in an attachment state (S-4), and mixing the primary solder and the secondary solder that are melted during the heat treatment and converting a resulting mixture into a tertiary solder including one solder layer (S-4).

The preparing of the semiconductor chip (S-1) may be an operation of preparing a semiconductor chip 100 on which an Al pad terminal 110 is formed to electrically connect an internal circuit and an external circuit, the Al pad terminal 110 may have a thin structure in a micrometer unit, and the semiconductor chip 100 may be manufactured in a state in which the Al pad terminal 110 is formed via metal deposition in a production line of the semiconductor chip 100.

Figure 2:
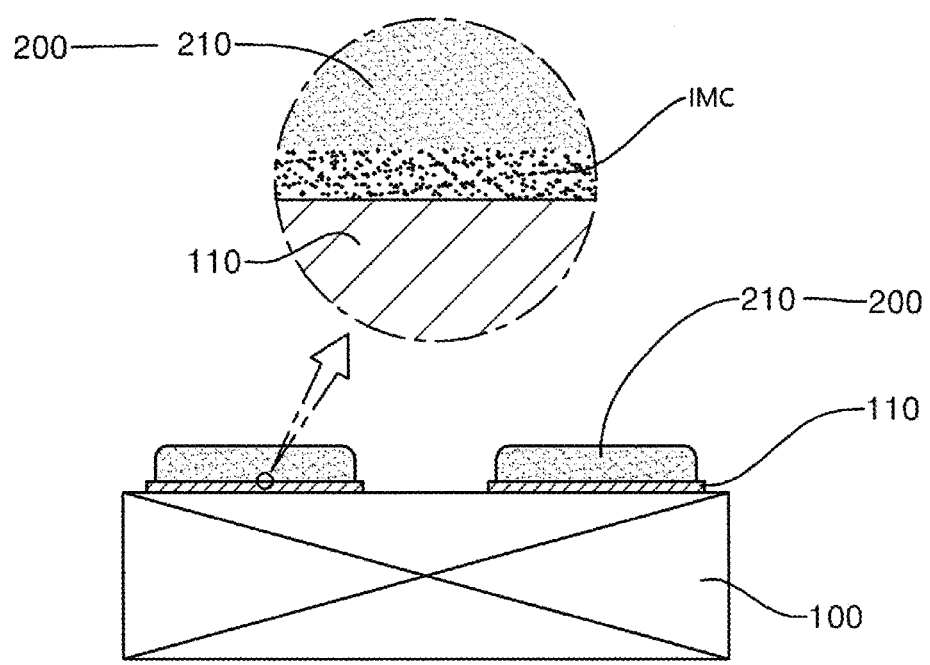
FIG. 2 is a cross-sectional view showing an operation of forming a solder bump on an aluminum (Al) pad terminal via a primary solder in a bonding method according to the present invention.

As shown in FIG. 2, the forming of the solder bump (S-2) may be an operation of performing solder via a primary solder 200 in order to form a solder bump 210 on the Al pad terminal 110. In this case, an intermetallic compound (IMC) may be distributed on a predetermined region of the solder bump 210 corresponding to a portion adjacent to the Al pad terminal 110 during a procedure of forming the solder bump 210.

The intermetallic compound (IMC) may be a compound generated via an interface reaction between a metal element in the primary solder 200 and a metal material that is separated while the Al pad terminal 110 is partially melted at a specific temperature or at a greater temperature during a soldering procedure. The IMC includes various metal components present in the primary solder 200, but according to the present invention, the IMC may include a predetermined amount of an aluminum (Al) component. The included Al may occupy 2 to 30 parts by weight based on 100 parts by weight of the IMC.

The IMC formed as described above has similar metal property to the Al pad terminal 110, and thus, may have low structural stress due to thermal expansion coefficients of the Al pad terminal 110 and the solder bump 210 and enhance durability and electrical connection properties.

Figure 3A:
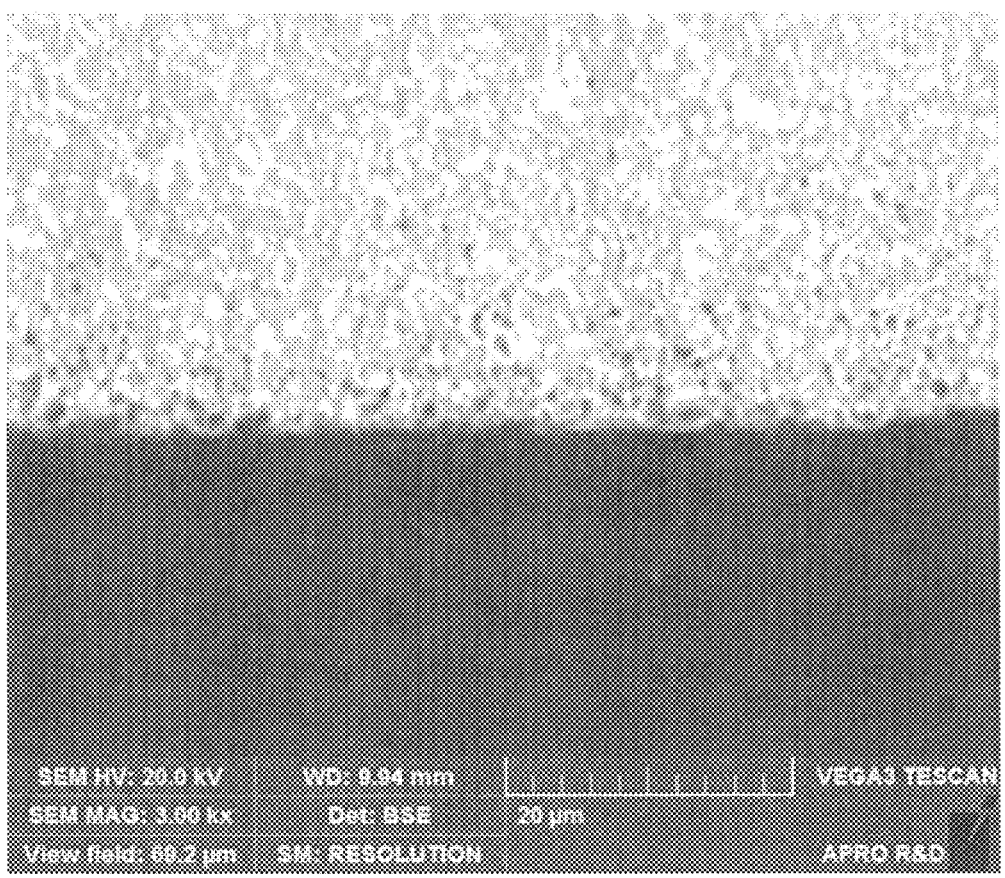
FIG. 3A is an enlarged view of distribution of an intermetallic compound (IMC) when a primary solder includes lead (Pb) as a main component according to the present invention.
Figure 3B:
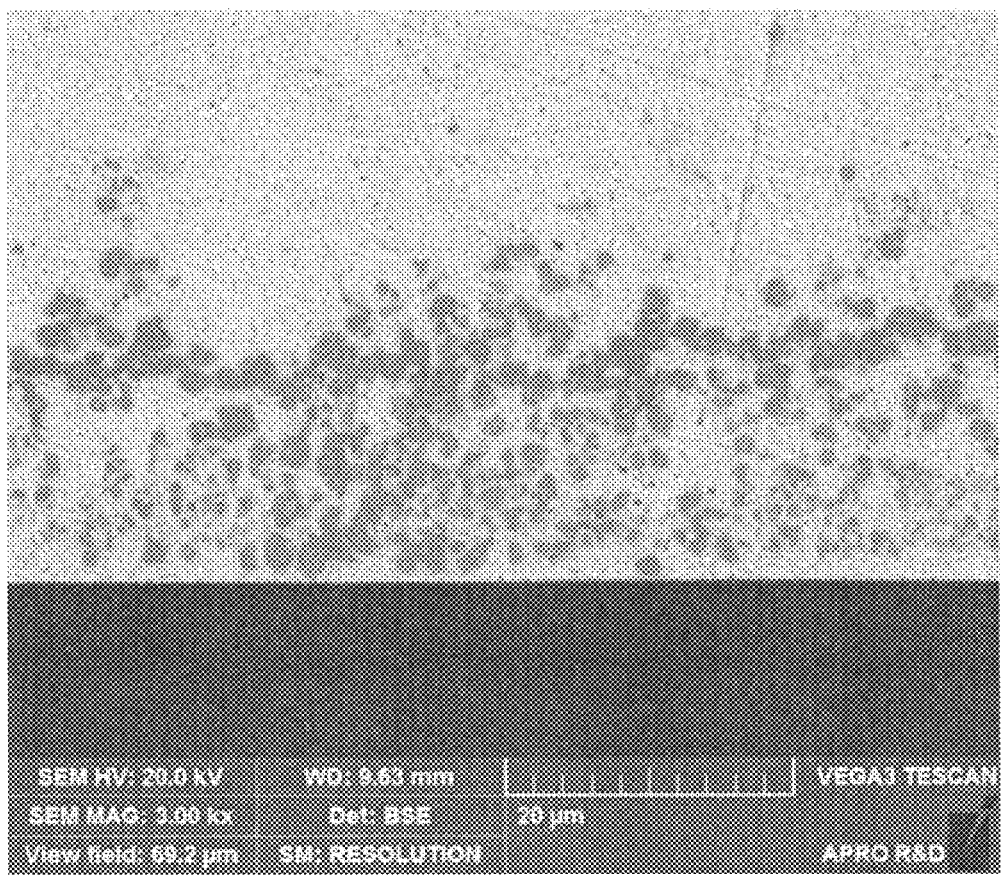
FIG. 3B is an enlarged view of distribution of an IMC when a primary solder includes tin (Sn) as a main component according to the present invention.

FIGS. 3A and 3B are enlarged images of the IMC. FIG. 3A shows the configuration of the IMC when the primary solder 200 including 80% of a lead (Pb) component or greater is used. In this case, the IMC may be densely distributed in a region with a height within about 20 micrometer based on a bonding boundary surface, as shown in the drawing.

FIG. 3B shows the configuration of the IMC when the primary solder 200 including 80% of tin (Sn) component or greater is used. The IMC may be dispersedly distributed in a region with a height within about 30 micrometer based on a bonding boundary surface, as shown in the drawing.

Figure 4:
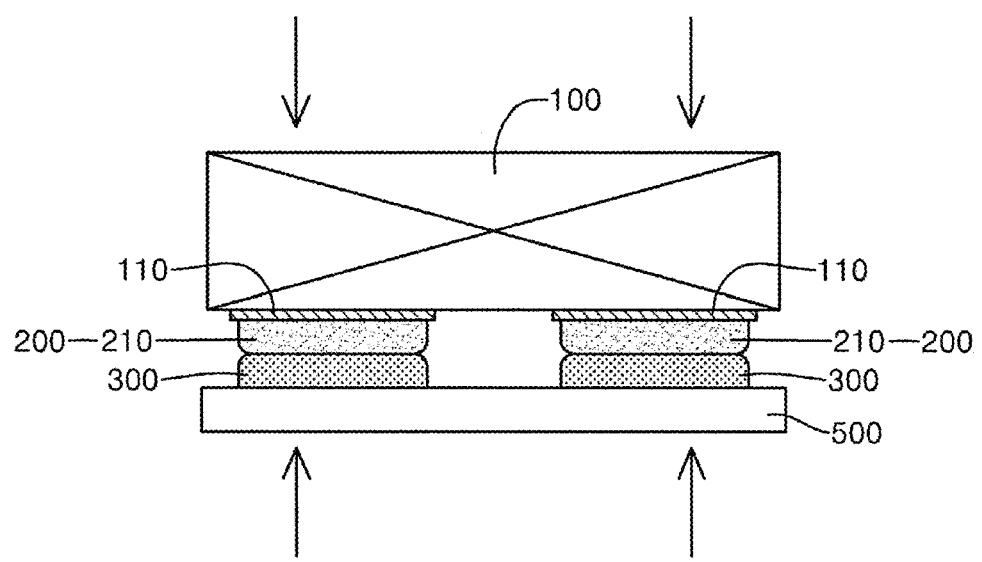
FIG. 4 is a cross-sectional view showing an operation of attaching a solder bump and a metal structure to each other via a secondary solder with a higher melting point than a melting point of a primary solder in a bonding method according to the present invention.

As such, after the solder bump 210 is formed, the attaching of the solder bump and the metal structure (S-3) may be performed, as shown in FIG. 4, and in this regard, the attaching method may be performed via a secondary solder 300. The secondary solder 300 and the primary solder 200 may have different components included therein, but according to the present invention, it may be important that a melting point of the secondary solder 300 is higher than a melting point of the primary solder 200. In a bonding procedure of the secondary solder 300, the secondary solder 300 in a paste state may contact the primary solder 200 in a hardened state in the form of a bump to attach the solder bump 210 and a metal structure 500 to each other.

The secondary solder 300 may function as adhesive for attachment between the solder bump 210 and the metal structure 500, but as a bonding method using a solder, the primary solder 200 and the secondary solder 300, that is, solders may be attached to each other.

Figure 6:
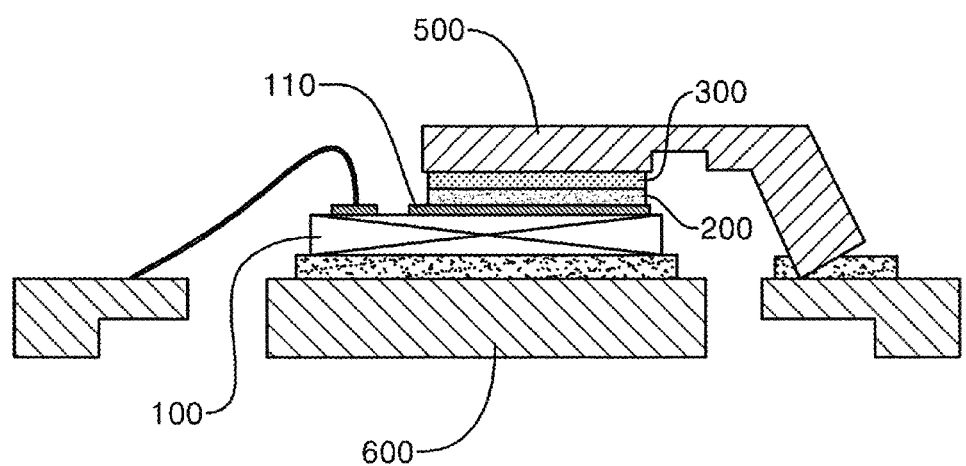
FIGS. 6 and 7 are diagrams showing an example of a method of bonding a metal structure configured in the form of a clip in a bonding method according to the present invention.
Figure 7:
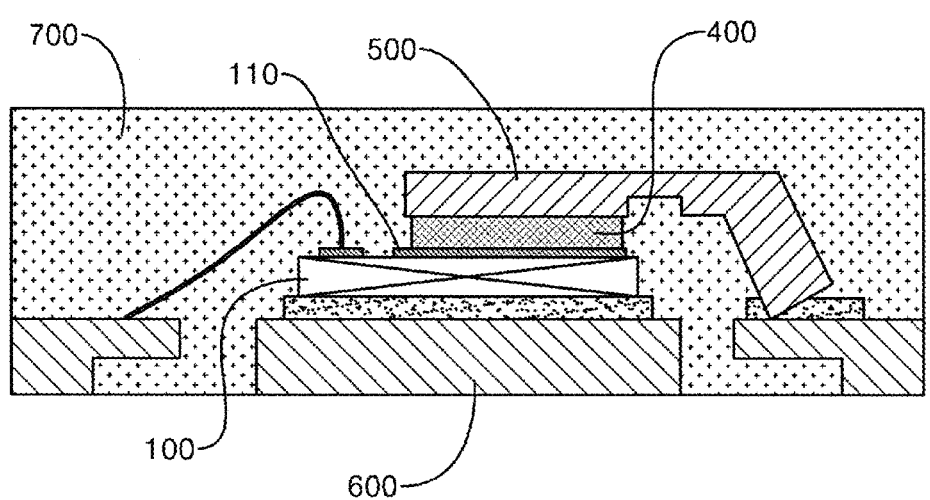
Figure 8:
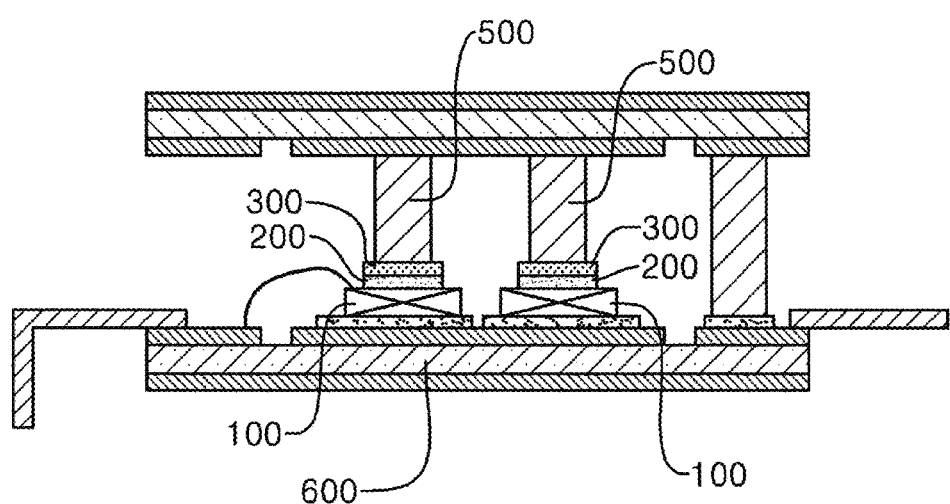
FIGS. 8 and 9 are diagrams showing an example of a method of bonding a metal structure configured in the form of a post in a bonding method according to the present invention.
Figure 9:
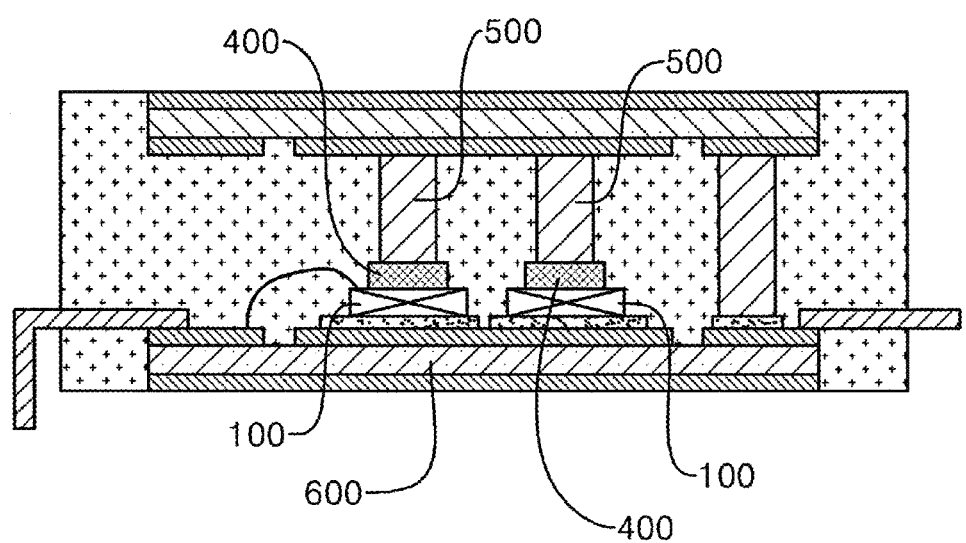

The metal structure 500 may be a target for electrically connection with a terminal of the semiconductor chip 100, and according to the present invention, the metal structure 500 may be configured in the form of a clip and may be connected to the terminal as shown in FIGS. 6 and 7, and the metal structure 500 may be configured in the form of a post and may be connected to the terminal as shown in FIGS. 8 and 9. Needless to say, other substrates with metal wirings formed thereon as well as the aforementioned form of the metal structure 500 may be applied.

The heat treatment (S-4) may be a process of heat treatment in a state in which the solder bump 210 and the metal structure 500 are attached to each other through the secondary solder 300. In this case, a heat treatment temperature may be determined to melt both the primary solder 200 and the secondary solder 300 based on a melting point of the secondary solder 300. In this case, a heat treatment time may be about 2 to about 10 minutes.

Figure 5:
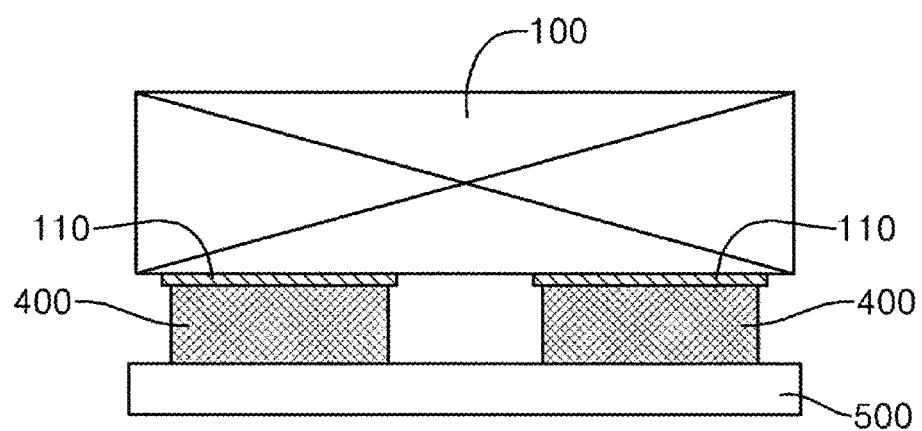
FIG. 5 is a cross-sectional view showing an operation of mixing primary and secondary solders that are melted during heat treatment and converting a resulting mixture into a tertiary solder including one solder layer in a bonding method according to the present invention.

Then, the converting into the tertiary solder (S-4) may be a process of mixing the primary solder 200 and the secondary solder 300 that are melted when heat treatment is performed in a predetermined time period during the heat treatment process shown in FIG. 5 and converting the resulting mixture into a tertiary solder 400 including one solder layer. The tertiary solder 400 formed as described above may have properties whereby a re-melting temperature is an intermediate value between a melting point of the primary solder 200 and a melting point of the secondary solder 300.

That is, as an example of a melting point of each solder, the primary solder 200 may have a melting point of 180 to 230° C., the secondary solder 300 may have a melting point of 260 to 350° C., and the tertiary solder 400 may have a melting point of 230 to 260° C.

As such, the primary solder 200 and the secondary solder 300 are melted and mixed to form the tertiary solder 400 because the tertiary solder 400 with an increased melting point compared with that of the solder bump 210 configured via the primary solder 200 may finally configure a soldering layer to prevent a re-melting phenomenon whereby a junction within a package is re-melted by a high temperature during a procedure of attaching a completed semiconductor package to a board.

Needless to say, when it is possible to achieve bonding using only the secondary solder 300 with the highest melting point, a re-melting phenomenon may be prevented, but when the secondary solder 300 with a melting point of 260 to 350° C. is used, an IMC may not be capable of being appropriately formed during a procedure of forming a bump on Al pad terminal 110, and thus, it is not possible to perform direct solder using the secondary solder 300. Accordingly, after the solder bump 210 is formed via the primary solder 200 with which aluminum (Al) soldering is possible, the primary solder 200 and the secondary solder 300 may be attached to each other and may be melted and mixed through heat treatment to form the tertiary solder 400 having intermediate properties of the primary solder 200 and the secondary solder 300.

Bonding may be achieved by such a bonding method because an IMC that is already generated during formation of the solder bump 210 may have properties that are not changed and are maintained even if heat corresponding to a higher temperature than a melting point of the primary solder 200 is applied during heat treatment.

According to the diverse exemplary embodiments of the present invention, a solder bump may be formed via a primary solder to bond an Al pad terminal and a metal structure to each other, and in this case, only a primary solder may not be used for bonding, but instead, the primary solder and a secondary solder with a different melting point from the primary solder may be melted and mixed and a resulting mixture may be lastly converted into tertiary solder, to advantageously enhancing heat resistance of a junction.

According to the present invention, properties of a melting point may be enhanced to prevent a re-melting phenomenon whereby a junction is re-melted under a high-temperature condition of a post-processing process using a completed semiconductor package, thereby reducing a fraction defective and enhancing a degree of completion of various electronic products.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A method of bonding a terminal of a semiconductor chip using a solder bump, the method comprising:
   preparing a semiconductor chip with an aluminum (Al) pad terminal formed thereon (S-1);
   forming the solder bump on the Al pad terminal through a primary solder (S-2);
   attaching the solder bump and a metal structure to each other via a secondary solder with a higher melting point than a melting point of the primary solder (S-3), wherein the secondary solder is positioned between the solder bump and the metal structure;
   performing a heat treatment in a state in which the solder bump and the secondary solder are attached to each other at a heat treatment temperature determined based on the melting point of the secondary solder (S-4); and
   mixing the primary solder and the secondary solder that are melted during the heat treatment and converting a resulting mixture into a tertiary solder including only one solder layer having a re-melting point higher than the melting point of the primary solder (S-5),
   wherein the forming the solder bump (S-2) comprises forming an intermetallic compound (IMC) on a portion of the solder bump adjacent to the Al pad terminal to be distributed by a predetermined region during formation of the solder bump,
   wherein the IMC includes Al.

2. The method of claim 1, wherein the primary solder has a melting point of 180 to 230° C., the secondary solder has a melting point of 260 to 350° C., and the tertiary solder has a melting point of 230 to 260° C.

3. The method of claim 1, wherein a ratio of the Al included in the IMC is 2 to 30 parts by weight based on 100 parts by weight of the entire IMC.

* * * * *